(12) United States Patent
Uhara et al.

(10) Patent No.: US 6,555,238 B2
(45) Date of Patent: Apr. 29, 2003

(54) POLYIMIDE FILM, METHOD OF MANUFACTURE, AND METAL INTERCONNECT BOARD WITH POLYIMIDE FILM SUBSTRATE

(75) Inventors: Kenji Uhara, Nagoya (JP); Naofumi Yasuda, Tokai (JP); Kouichi Sawasaki, Nagoya (JP)

(73) Assignee: DuPont-Toray Co. Ltd., Tokyo (JP)

( * ) Notice: Subject to any disclaimer, the term of this patent is extended or adjusted under 35 U.S.C. 154(b) by 0 days.

(21) Appl. No.: 09/927,647

(22) Filed: Aug. 10, 2001

(65) Prior Publication Data
US 2002/0045054 A1 Apr. 18, 2002

(30) Foreign Application Priority Data
Aug. 24, 2000 (JP) ........................................ 2000-253525

(51) Int. Cl.[7] ............................................... B32B 15/08
(52) U.S. Cl. .................... 428/458; 428/473.5; 528/125; 528/126; 528/128; 528/172; 528/179; 528/182; 528/188; 528/351; 528/353
(58) Field of Search .............................. 428/473.5, 458; 528/125, 126, 128, 172, 179, 182, 188, 351, 353

(56) References Cited

U.S. PATENT DOCUMENTS

| 5,081,229 A | * | 1/1992 | Akahori et al. ............. 528/353 |
| 5,939,498 A | | 8/1999 | Coverdell, et al. .......... 525/432 |

FOREIGN PATENT DOCUMENTS

| EP | 0276405 A | 8/1988 |
| JP | 63-175025 | 7/1988 |
| JP | 1-131241 | 5/1989 |
| JP | 1-131242 | 5/1989 |
| JP | 3-46292 | 1/1991 |

OTHER PUBLICATIONS

Patent Abstracts of Japan, vol. 017, No. 458, Aug. 20, 1993 & JP 05 105755 A (Sumitomo Bakelite Co. Ltd.), Apr. 27, 1993.
Patent Abstracts of Japan, vol. 1999, No. 02, Feb. 26, 1999 & JP 10 298286 A (Du Pont Toray Co. Ltd.), Nov. 10, 1998.
Patent Abstracts of Japan, vol. 2000, No. 07, Sep. 29, 2000 & JP 2000 119418 A (Du Pont Toray Co. Ltd.), Apr. 25, 2000.
Database WPI, Section Ch, Week 199237, Derwent Publications Ltd., London GB; AN 1992–302633 XP002186017 & JP 04 207094 A (Kaneka Corp).), Jul. 29,1992.
"Polymer Alloys: New Prospects and Practical Applications," in *High Added Value of Polymer Series*, edited by M. Akiyama and J. Izawa, published in Japan by CMC K.K., Apr., 1977.
Mita et al., (*J. Polym. Sci. Part C: Polym. Lett. 26, No. 5, 215–223*), John Wiley & Sons.
Yui et al. ("Functional Supermolecules: Their Design of and Future Prospects," in *New Materials Series*, edited by N. Ogata, M. Terano and N. Yui, published in Japan by CMC K.K., Jun. 1998).

* cited by examiner

*Primary Examiner*—Leszek Kiliman

(57) ABSTRACT

A polyimide film is manufactured from a random copolymeric, block copolymeric or interpenetrating polymer network-type polyamic acid prepared from pyromellitic dianhydride in combination with 22 to 78 mol % of 4,4'-oxydianiline and 22 to 78 mol % of 3,4'-oxydianiline, based on the overall diamine. The polyimide film, when used as a metal interconnect board substrate in flexible circuits, chip scale packages (CSP), ball grid arrays (BGA) or tape-automated bonding (TAB) tape by providing metal interconnects on the surface thereof, achieves a good balance between a high elastic modulus, a low thermal expansion coefficient, alkali etchability and film formability.

12 Claims, No Drawings

POLYIMIDE FILM, METHOD OF MANUFACTURE, AND METAL INTERCONNECT BOARD WITH POLYIMIDE FILM SUBSTRATE

BACKGROUND OF THE INVENTION

1. Field of the Invention

The present invention relates to a polyimide film which has a high elastic modulus, a low thermal expansion coefficient, alkali etchability and excellent film-forming properties when used as a metal interconnect board substrate on the surface of which metal interconnects are provided to form a flexible printed circuit or tape-automated bonding (TAB) tape. The invention relates also to a method for manufacturing such film. The invention additionally relates to a metal interconnect board for use in flexible printed circuits or TAB tape in which the foregoing polyimide film serves as the substrate.

2. Description of the Related Art

TAB tape is constructed of a heat-resistant film substrate on the surface of which are provided very fine metal interconnects. In addition, the substrate has openings, or "windows," for mounting integrated circuit (IC) chips. Sprocket holes for precisely feeding the TAB tape are provided near both edges of the tape.

IC chips are embedded in the windows on the TAB tape and bonded to the metal interconnects on the tape surface, following which the mounted chip-bearing TAB tape is bonded to a printed circuit for wiring electronic equipment. TAB tape is used in this way to automate and simplify the process of mounting IC chips on an electronic circuit, and also to improve manufacturing productivity and enhance the electrical characteristics of electronic equipment containing mounted IC chips.

TAB tapes currently in use have either a three-layer construction composed of a heat-resistant substrate film on the surface of which an electrically conductive metal foil has been laminated with an intervening layer of polyester, acrylic, epoxy or polyimide-based adhesive, or a two-layer construction composed of a heat-resistant substrate film on the surface of which a conductive metal layer has been directly laminated without an intervening layer of adhesive.

The substrate film in TAB tape is thus required to be heat resistant. Polyimide film in particular has been used to ensure that the substrate film is able to withstand high-temperature operations such as soldering when IC chips are bonded to the metal interconnects on TAB tape and when the IC chip-bearing TAB tape is bonded to a printed circuit for wiring electronic equipment.

However, the heat incurred in the process of laminating polyimide film with metal foil or a metal layer then chemically etching the metal foil or metal layer to form metal interconnects may elicit differing degrees of dimensional change in the polyimide film and metal, sometimes causing considerable deformation of the TAB tape. Such deformation can greatly hinder or even render impossible subsequent operations in which IC chips are mounted on the tape and the IC chip-bearing TAB tape is bonded to a printed circuit for wiring electronic equipment. Accordingly, a need has been felt for some way to make the thermal expansion coefficient of polyimide film closer to that of the metal so as to reduce deformation of the TAB tape.

Moreover, reducing dimensional change due to tensile and compressive forces in TAB tape on which IC chips have been mounted and which has been bonded to a printed circuit for wiring electronic equipment is important for achieving finer-pitch metal interconnects, reducing strain on the metal interconnects and reducing strain on the mounted IC chips. To achieve this end, the polyimide film used as the substrate must have a higher elastic modulus.

According to the definition of a polymer alloy or blend (see "Polymer Alloys: New Prospects and Practical Applications," in *High Added Value of Polymer Series*, edited by M. Akiyama and J. Izawa, published in Japan by CMC K.K., April 1997), block, blend, interpenetrating polymer network (IPN) and graft polymerization all fall within the category of processes capable of increasing the elastic modulus of a polymer.

With respect to polyimides in particular, Mita et al. (*J. Polym. Sci. Part C: Polym. Lett.* 26, No. 5, 215–223) suggest that, on account of the molecular composite effect, a blend of different polyimides can more readily attain a high elastic modulus than a copolyimide obtained from the same starting materials. However, because polyimide molecules have large molecular cohesive forces, mere blends of such molecules tend to take on a phase-separated structure. Some form of physical bonding is needed to inhibit such phase separation.

An interpenetrating network polymer was proposed for this very purpose by Yui et al. ("Functional Supermolecules: Their Design of and Future Prospects," in *New Materials Series*, edited by N. Ogata, M. Terano and N. Yui, published in Japan by CMC K.K., June 1998).

A specific example of a blend according to the prior-art is disclosed in JP-A 63-175025, which relates to polyamic acid compositions (C) made up of a polyamic acid (A) of pyromellitic acid and 4,4'-diaminodiphenyl ether and a polyamic acid (B) of pyromellitic acid and phenylenediamine. JP-A 63-175025 also discloses polyimides prepared from such polyamic acid compositions (C).

However, the methods provided in this prior art involve first polymerizing the different polyamic acids, then blending them together. Because thorough physical interlocking of the type seen in an interpenetrating network polymer cannot be achieved in this way, phase separation may occur during imidization of the polyamic acid. In some cases, a slightly hazy polyimide film is all that can be obtained.

JP-A 1-131241, JP-A 1-131242, U.S. Pat. No. 5,081,229 and JP-A 3-46292 disclose block copolyimide films manufactured from block copolyamic acids composed of pyromellitic dianhydride, p-phenylenediamine, and 4,4'-diaminodiphenyl ether. This prior art also discloses methods for manufacturing copolyamic acid films composed of block components of ultimately equimolar composition by reacting non-equal parts of the diamines and the acid dianhydride in an intermediate step.

However, in such prior-art processes, although the polyamic acid blend solution prepared is not prone to phase separation, the molecular composite effect is inadequate and a satisfactory increase in rigidity is not always achieved. Moreover, because polymer production involves copolymerization using block components in which the molecular chains are regulated, the reaction steps are complex and reaction takes a longer time. Also, the reaction passes through a step in which there exists an excess of reactive end groups, which tends to destabilize the polyamic acid in the course of production, making it subject to changes in viscosity and gelation. In addition to these and other production problems, the above prior-art methods sometimes fail to provide a film having a sufficiently high Young's modulus.

The surface of the polyimide film substrate is sometimes roughened by etching with an alkali solution prior to use so as to improve the adhesive strength of an adhesive applied thereto. Alkali etching is also at times used to form through holes or vias for interconnects. Accordingly, there has arisen a desire for polyimide films having excellent alkali etchability.

The planarity of the film can be improved by increasing the stretch ratio during film production, and so film compositions capable of being subjected to a high-ratio orientation are also desired.

Methods for producing polyimide films which satisfy such requirements have already been proposed. For example, JP-A 1-131241, JP-A 1-131242 and JP-A 3-46292 provide polyimide films made from polyamic acid prepared from pyromellitic dianhydride, p-phenylenediamine, and 4,4'-diaminodiphenyl ether. The same prior art also teaches processes for producing block component-containing polyamic acid film by reacting non-equal parts of diamine and acid dianhydride in an intermediate step.

However, the above-described prior art methods provide polyimide films which have properties when used as a substrate for metal interconnect boards, which need to be improved.

It is therefore an object of the invention to provide a polyimide film which has a high elastic modulus, a low thermal expansion coefficient, alkali etchability and excellent film formability when used as a metal interconnect board substrate of a type that can be provided on the surface with metal interconnects to form a flexible printed circuit, chip scale packages, ball grid arrays or TAB tape. Another object of the invention is to provide a method of manufacturing such a film. A further object of the invention is to provide a metal interconnect board in which the foregoing polyimide film serves as the substrate.

SUMMARY OF THE INVENTION

The present invention is directed to a polyimide film manufactured from a polyamic acid prepared from pyromellitic dianhydride in combination with 22 to 78 mol % of 4,4'-oxydianiline and 22 to 78 mol % of 3,4'-oxydianiline, based on the overall diamine.

In another embodiment, the present invention is directed to a polyimide film manufactured from a block component or interpenetrating polymer network component-containing polyamic acid prepared from pyromellitic dianhydride in combination with 22 to 78 mol % of 4,4'-oxydianiline and 22 to 78 mol % of 3,4'-oxydianiline, based on the overall diamine.

In another embodiment, the present invention is directed to a method of production comprising the steps of, in order:

(A) reacting starting materials comprising (a1) a tetracarboxylic acid dianhydride comprising pyromellitic dianhydride and (a2) a first diamine selected from 4,4'-oxydianiline and 3,4'-oxydianiline, in an inert solvent to form a first polyamic acid containing a component selected from a block component of the first diamine and pyromellitic dianhydride and an interpenetrating polymer network component of the first diamine and pyromellitic dianhydride;

(B) adding to the first polyamic acid prepared in step A additional materials comprising (b1) a tetracarboxylic acid dianhydride comprising pyromellitic dianhydride and (b2) a second diamine selected from 4,4'-oxydianiline and 3,4'-oxydianiline, and continuing the reaction with all the materials to form a second polyamic acid solution;

(C) mixing into the second polyamic acid solution obtained in step B a chemical agent capable of converting the polyamic acid into polyimide;

(D) casting or extruding the mixture from step C onto a smooth surface to form a polyamic acid-polyimide gel film.

(E) heating the gel film at 200 to 500° C. to transform the polyamic acid to polyimide wherein at least one of the first diamine and second diamine is a phenylenediamine, and at least one of the first diamine and second diamine is 4,4'-oxydianiline.

In another embodiment, the invention is directed to a metal interconnect board for flexible printed circuits or TAB tape, which board is produced by using any of the above-described polyimide films of the invention as the substrate and providing metal interconnects on the surface thereof.

DETAILED DESCRIPTION OF THE PREFERRED EMBODIMENTS

The polyimide making up the inventive film may be a block copolymer, a random copolymer or an IPN polymer.

Preferred block components or IPN polymer components are polyamic acids composed of 4,4'-oxydianiline and pyromellitic dianhydride, and polyamic acids composed of 3,4'-oxydianiline and pyromellitic dianhydride. After forming a polyamic acid containing such block components or IPN polymer components, the polyamic acid is imidized to give a block component or IPN polymer component-containing polyimide.

The polyamic acid-forming reaction is divided and carried out in at least two stages. First, a block component or an IPN polymer component-containing polyamic acid is formed. In a second step, this polyamic acid is reacted with additional diamine and dianhydride to form additional polyamic acid. The polyimide polymer is formed by imidization after the second step.

The polyimide polymer of the present invention can be used to form a polyimide film having a good balance of properties suitable for use as the substrate in metal interconnect boards for flexible printed circuits, chip scale packages, ball grid arrays and TAB tapes; namely, a high elastic modulus, a low thermal expansion coefficient, alkali etchability, and film formability.

By additionally incorporating in the polyimide polymer a block component or an IPN polymer component, the various above properties can be brought within even more preferable ranges. The block component or IPN polymer component used for this purpose is most preferably one prepared by the reaction of 3,4'-oxydianiline with pyromellitic dianhydride.

The diamines used in the invention are flexible diamines such as 4,4'-oxydianiline and semi-rigid diamines such as 3,4'-oxydianiline. The polyimide is produced by the imidization of a polyamic acid prepared using about 22 to 78 mol %, and preferably 30 to 70 mol %, of 4,4'-oxydianiline, based on the total molar amount of diamines. In the practice of the invention, 4,4'-oxydianiline serves to increase film flexibility.

In the invention, 3,4'-oxydianiline increases film elongation and improves film formability. At less than 25 mol % of 3,4'-oxydianiline, the coefficient of thermal expansion (CTE) is higher, the modulus is lower and the warpage is higher than desired. On the other hand, more than 75 mol % of 3,4'-oxydianiline lowers the glass transition temperature (Tg), resulting in excessive thermal shrinkage and a poor heat resistance. Preferably, the amount of 3,4'-oxydianiline is about 30 to 70 mol %, based on the total molar amount of diamines.

The tetracarboxylic dianhydride used in the invention is pyromellitic dianhydride, although concomitant use may be made of other tetracarboxylic dianhydrides within a range in the amount of addition that does not compromise the objects of the invention. For example, less than 50 mol % of biphenyltetracarboxylic dianhydride or benzophenonetetracarboxylic dianhydride may be used.

The resulting polyamic acid is converted to the polyimide by imidization.

The elastic modulus of the polyimide film can be adjusted by varying the proportion of 3,4'-oxydianiline in the diamine used to prepare the polyamic acid. Increasing the amount of 3,4'-oxydianiline increases the elastic modulus and dimensional stability, but lowers the heat resistance. It is thus necessary to adjust the molar ratio of the respective constituents with great care in order to achieve a good balance in the various properties.

The polyimide film according to the invention is preferably manufactured from a block component or interpenetrating polymer network component-containing polyamic acid prepared from pyromellitic dianhydride in combination with 30 to 70 mol % of 4,4'-oxydianiline and 30 to 70 mol % of 3,4'-oxydianiline, based on the overall diamine.

The polyimide film of the invention can be manufactured by a combination of conventional methods for making polyimide, although a preferred method of production for easily achieving the inventive polyimide film comprises the steps of, in order:

(A) reacting starting materials comprising (a1) a tetracarboxylic acid dianhydride comprising pyromellitic dianhydride and (a2) a first diamine selected from 4,4'-oxydianiline and 3,4'-oxydianiline, in an inert solvent to form a first polyamic acid containing a component selected from a block component of the first diamine and pyromellitic dianhydride and an interpenetrating polymer network component of the first diamine and pyromellitic dianhydride;

(B) adding to the first polyamic acid prepared in step A additional materials comprising (b1) a tetracarboxylic acid dianhydride comprising pyromellitic dianhydride and (b2) a second diamine selected from 4,4'-oxydianiline and 3,4'-oxydianiline, and continuing the reaction with all the materials to form a second polyamic acid solution;

(C) mixing into the second polyamic acid solution obtained in step B a chemical agent capable of converting the polyamic acid into polyimide;

(D) casting or extruding the mixture from step C onto a smooth surface to form a polyamic acid-polyimide gel film.

(E) heating the gel film at 200 to 500° C. to transform the polyamic acid to polyimide.

In the above method of manufacturing polyimide film, the polyamic acid is a block component or interpenetrating polymer network component-containing polyamic acid prepared from pyromellitic dianhydride in combination with 22 to 78 mol % of 4,4'-oxydianiline and 22 to 78 mol % of 3,4'-oxydianiline, based on the overall diamine.

The polyamic acid of the invention is generally prepared at a temperature of not more than 175° C., and preferably not more than 90° C., by reacting the above-described tetracarboxylic dianhydride and diamine in a molar ratio of about 0.90 to 1.10, preferably 0.95 to 1.05, and most preferably 0.98 to 1.02, within an organic solvent that is non-reactive for each of these constituents.

Each of the above constituents may be added independently and successively or simultaneously to an organic solvent. Alternatively, a mixture of the constituents may be added to an organic solvent. However, to carry out a uniform reaction, it is advantageous to add each constituent successively to the organic solvent.

If successive addition is carried out, the order in which the constituents are added is preferably one in which precedence is given to the diamine and tetracarboxylic dianhydride constituents used to prepare the block component or IPN polymer component. That is, the reaction involved in the production of a polyamic acid containing a block component or an IPN polymer component is divided into at least two stages. First, a block component or IPN polymer component-containing polyamic acid is formed. In a second step, this polyamic acid is reacted with additional diamine and dianhydride to form additional polyamic acid. The polyimide polymer is formed by imidization after the second step.

The time required to form the block component or IPN polymer component may be selected based on the reaction temperature and the proportion of block component or IPN polymer component within the polyamic acid, although experience shows that a time within a range of about 1 minute to about 20 hours is suitable.

As discussed later in the specification, to form a block component-containing polymer, it is preferable for the diamine and the tetracarboxylic dianhydride reacted in reaction step (A) to be substantially non-equimolar. To form an IPN polymer component, it is preferable for the diamine and the tetracarboxylic dianhydride in reaction step (A) to be substantially equimolar or, in cases where the reaction passes through a reaction step in which excess diamine is present, for the ends to be capped with a dicarboxylic anhydride. The reason for having the diamine and the tetracarboxylic dianhydride substantially equimolar or, in a reaction step involving the presence of excess diamine, for having the ends capped with a dicarboxylic anhydride is to make the block component or IPN polymer component formed in these reaction steps chemically inert so as not to be incorporated onto the ends of the polyimide polymer formed in the subsequent reaction step. At the same time, carrying out the block component or IPN polymer component reaction and the subsequent polyimide forming reaction in the same reactor facilitates the formation of molecular composites (composites between different molecules), making it possible to better manifest the distinctive features of the block component or IPN polymer component.

A specific example is described below of the preparation of a polyimide containing a block component or an IPN polymer component composed of pyromellitic dianhydride and 3,4'-oxydianiline by using pyromellitic dianhydride as the tetracarboxylic dianhydride and both 4,4'-oxydianiline and 3,4'-oxydianiline as the diamines.

First, 3,4'-oxyaniline is dissolved in dimethylacetamide as the organic solvent, then pyromellitic dianhydride is added and the block component or IPN polymer component reaction is carried out to completion.

4,4'-Oxydianiline is then dissolved in the solution, following which pyromellitic dianhydride is added and the reaction is effected, giving a three-ingredient polyamic acid solution containing a block component or IPN polymer component of 3,4'-oxydianiline and pyromellitic dianhydride.

It is possible in this case to control the size of the block component or IPN polymer component by adding a trace amount of 4,4'-oxydianiline to the 3,4'-oxydianiline initially added, or by having the 3,4'-oxydianiline and pyromellitic dianhydride initially reacted be non-equimolar and adding an amount of end-capping agent sufficient to fully react with the excess diamine. However, to take full advantage of the effects of the block component or IPN polymer component, it is preferable to prepare an IPN polymer in which the 3,4'-oxydianiline and the pyromellitic dianhydride are substantially equimolar.

The end-capping agent, typically a dicarboxylic anhydride or a silylating agent, is preferably added within a range of 0.001 to 2%, based on the solids content (polymer concentration). Preferred examples of dicarboxylic anhydrides include acetic anhydride and phthalic anhydride. Preferred examples of silylating agents include non-halogenated hexamethyidisilazane, N,O-(bistrimethylsilyl) acetamide and N,N-bis(trimethylsiiyl)urea.

The end point of polyamic acid production is determined by the polyamic acid concentration in the solution and by the solution viscosity. Addition at the end of the process of a portion of the reactants as a solution in the organic solvent used in the reaction is effective for precisely determining the solution viscosity at the end point, although adjustment is required to keep the polyamic acid concentration from falling too low.

The polyamic acid concentration within the solution is from 5 to 40 wt %, and preferably from 10 to 30 wt %.

The organic solvent is preferably selected from organic solvents which do not react with the various reactants or the polyamic acid obtained as the polymer product, which can dissolve at least one and perhaps all of the reactants, and which dissolve the polyamic acid.

Preferred examples of the organic solvent include N,N-dimethylacetamide, N,N-diethylacetamide, N,N-dimethylformamide, N,N-diethylformamide and N-methyl-2-pyrrolidone. Any one or mixture thereof may be used. In some cases, concomitant use may be made of a poor solvent such as benzene.

During manufacture of the inventive polyimide film, the polyamic acid solution thus prepared is pressurized with an extruder or a gear pump and delivered to the polyamic acid film producing step.

The polyamic acid solution is passed through a filter to remove any foreign matter, solids and high-viscosity impurities which may be present in the starting materials or which may have formed in the polymerization step. The filtered solution is then passed through a film-forming die or a coating head, extruded in the form of a film onto the surface of a rotating or laterally moving support, and heated from the support to give a polyamic acid-polyimide gel film in which some of the polyamic acid has imidized. The gel film is self-supporting. When the film reaches a peelable state, it is peeled from the support and introduced into an oven, where it is heated and the solvent is removed by drying to complete imidization, thereby giving the final polyimide film.

The use here of a sintered metal fiber filter having a cutoff of 20 µm is advantageous for excluding gel products that have formed during the process. A sintered metal fiber filter having a cutoff of 10 µm is preferred, and a sintered metal fiber filter with a cutoff of 1 µm is especially preferred.

Imidization of the interpenetrating polyamic acid may be carried out by a thermal conversion process in which heating alone is used, or by a chemical conversion process wherein polyamic acid containing an imidizing agent is heat treated or the polyamic acid is immersed in an imidizing agent bath. In the practice of the invention, if the polyimide film is to be used in a metal interconnect circuit substrate for flexible printed circuits, chip scale packages, ball grid arrays or TAB tape, chemical conversion is preferable to thermal conversion for achieving a good balance of properties, and specifically a high elastic modulus, a low thermal expansion coefficient, alkali etchability, and film formability.

Moreover, a manufacturing process in which an imidizing agent is mixed into the polyamic acid and the solution is formed into a film then heat-treated to effect chemical conversion offers numerous advantages, including a short imidization time, uniform imidization, easy peeling of the film from the support, and the ability to handle in a closed system imidizing agents which have a strong odor and must be isolated. Accordingly, the use of this type of process is preferable to a process in which the polyamic acid film is immersed in a bath of the imidizing agent and the dehydrating agent.

A tertiary amine which promotes imidization and a dehydrating agent which absorbs the water that forms in imidization are used together as the imidizing agent in the invention. Typically, the tertiary amine is added to and mixed with the polyamic acid in an amount that is substantially equimolar to or in a slight [stoichiometric] excess relative to the amount of amic acid groups in the polymer. The dehydrating agent is added to the polyamic acid in an amount that is about twice equimolar or in a slight [stoichiometric] excess relative to the amount of amic acid groups in the polymer. However, the amounts of addition may be suitably adjusted to achieve the desired peel point from the support.

The imidizing agent may be added at any time from polymerization of the polyamic acid to when the polyamic acid solution reaches the film-forming die or coating head. To prevent imidization from occurring during delivery of the solution, the imidizing agent is preferably added to the polyamic acid solution and mixed therewith in a mixer a little before the solution reaches the film-forming die or coating head.

The tertiary amine is preferably pyridine or β-picoline, although use can also be made of other tertiary amines such as α-picoline, 4-methylpyridine, isoquinoline or triethylamine. The amount may be adjusted according to the activity of the particular tertiary amine used.

Acetic anhydride is most commonly used as the dehydrating agent, although use can also be made of other dehydrating agents such as propionic an hydride, butyric anhydride, benzoic acid anhydride or formic acid anhydride.

Imidization of the imidizing agent-containing polyamic acid film proceeds on the support owing to heat received from both the support and the space on the opposite side of the film, resulting in a partially imidized polyamic acid-polyimide gel film which is then peeled from the support.

A larger amount of heat received from the support and the space on the opposite side of the film accelerates imidization and allows more rapid peeling of the film. However, too much heat results in the rapid release of organic solvent volatiles between the support and the gel film, causing undesirable deformation of the film. A suitable heat quantity should therefore be selected after due consideration of both the peel point position and potential film defects.

The gel film that has been peeled from the support is carried to an oven, where the solvent is removing by drying and imidization is completed.

The gel film contains a large amount of organic solvent, and thus undergoes a large reduction in volume during drying. To concentrate dimensional shrinkage from such volumetric reduction in the direction of film thickness, the gel film is generally held at both edges with tenter clips and passed through a drying apparatus, or tenter frame, by the forward movement of the tenter clips. Inside the tenter frame, the film is heated, thereby integrally carrying out both drying (removal of the solvent) and imidization.

Such drying and imidization are carried out at a temperature of 200 to 500° C. The drying temperature and the imidization temperature may be the same or different, although increasing the temperature in a stepwise manner is preferred. Typically, to prevent film blistering due to removal of the solvent, a somewhat low temperature within the above range is used at the stage where a large amount of solvent is removed by drying. Once the danger of film blistering has passed, the temperature is ramped up to a higher level within the above range to accelerate imidization.

Within the tenter frame, the film can be stretched or relaxed by increasing or decreasing the distance between the tenter clips at both edges of the film.

Preferably, cut sheets of block component or IPN polymer component-containing polyimide film obtained by using chemical conversion to effect imidization are cut from a film that has been continuously manufactured in the manner described above. However, a small amount of the same type of film can be produced by a process in which, as described subsequently in the examples, a block component or IPN polymer component-containing polyamic acid is prepared within a plastic or glass flask, following which a chemical conversion agent is mixed into the polyamic acid solution and the resulting mixture is cast onto a support such as a glass plate and heated to form a partially imidized self-supporting polyamic acid-polyimide gel film. The resulting film is peeled from the support, attached to a metal holding frame or similar apparatus to prevent dimensional change, and heated, thereby drying the film (removing the solvent) and effecting imidization.

Compared with polyimide films obtained by thermal conversion, polyimide films according to the invention that have been thus manufactured by using chemical conversion to effect imidization, when employed as a metal interconnect circuit substrate in flexible printed circuits, chip scale packages, ball grid arrays and TAB tape, provide a high elastic modulus, a low thermal expansion coefficient, a low moisture expansion coefficient, and a low moisture uptake. Moreover, they have excellent alkali etchability.

Therefore, metal interconnect boards for flexible printed circuits, chip scale packages, ball grid arrays or TAB tape that are manufactured by using the inventive polyimide film as the substrate and providing metal interconnects on the surface thereof exhibit a high performance characterized by an excellent balance of properties; namely, a high elastic modulus, a low thermal expansion coefficient, alkali etchability, and excellent film formability.

The polyimide film of the invention has an elastic modulus of preferably 3 to 5.5 GPa, and more preferably 4 to 5 GPa. A low elastic modulus results in poor film travel, making the film difficult to handle, whereas a high elastic modulus results in poor flexibility. If the linear expansion coefficient is too large or small, excessive curling occurs when the film is laminated with metal. Accordingly, a thermal expansion coefficient of 10 to 20 ppm/°C. is preferred. A moisture uptake of no more than 2%, and especially no more than 1%, is preferred.

The alkali etchability is preferably such as to allow dissolution of the film. As described below, evaluation of the alkali etchability can be carried out based on the surface etch rate under alkaline conditions.

In the soldering step, the film is exposed to elevated temperatures close to 300° C. Hence, it is preferable for the film to have a low thermal shrinkage. In some cases, use of the film can be difficult if the thermal shrinkage is greater than 1%. Hence, a thermal shrinkage of not more than 1%, and especially not more than 0.1% is preferred.

EXAMPLES

Examples are given below by way of illustration, although the examples are not intended to limit the invention. The various film properties were measured as described below.

Abbreviations

DMAc dimethylacetamide

34'-ODA 3,4'-oxydianiline, also referred to as 3,4'-diaminodiphenyl ether

44'-ODA 4,4'-oxydianiline, also referred to as 4,4'-diaminodiphenyl ether

PDA p-phenylenediamine

PMDA pyromellitic dianhydride

Test Procedures (1) Elastic Modulus and Elongation at Break

The elastic modulus was determined in accordance with JIS K7113 from the slope of the first rise in the tension-strain curve obtained at a test rate of 300 mm/min using a Tensilon tensile tester manufactured by Orientech Inc.

The elongation at break was obtained as the elongation when the same test specimen broke.

(2) Thermal Expansion Coefficient

The temperature of a sample was increased at a rate of 10° C./min then decreased at a rate of 5° C./min using a TMA-50 thermomechanical analyzer manufactured by Shimadzu Corporation. The dimensional change in the sample from 50° C. to 200° C. at the time of the second rise or fall in temperature was used to determine the thermal expansion coefficient.

(3) Moisture Uptake

A film sample was held for 48 hours in a test chamber (STPH-101, manufactured by Tabai Espec Corp.) kept at 25° C. and 95% relative humidity. The moisture uptake was the weight gain relative to the weight of the sample when dry, expressed as a percentage of the dry weight.

(4) Alkali Etchability

One surface of a polyimide film sample was placed in contact with a 1 N potassium hydroxide solution in ethanol/water (80/20 by volume) at 40° C. for 120 minutes, and the film thickness before and after contact was measured using a Litematic thickness gauge (supplied by Mitutoyo Corp.). The alkali etchability was rated as shown below based on the percent change in thickness.

Good: Change in thickness of at least 5%

Fair: Change in thickness of at least 1% but less than 5%

Poor: Change in thickness of less than 1%

(5) Warping of Metal Laminate

A polyimide-base adhesive was coated onto the polyimide film, and copper foil was laminated thereon at a temperature of 250° C. The adhesive was then cured by raising the temperature to a maximum of 300° C. The resulting metal laminate was cut to a sample size of 35×120 mm. The samples were held for 24 hours at 25° C. and 60% relative humidity, following which the extent of warp in each sample was measured. Measurement consisted of placing the sample on a flat sheet of glass, and measuring and averaging the height of the four corners. The extent of warping was rated as indicated below. A "Large" rating means that use of the sample as a metal interconnect board would result in handling problems during conveyance in subsequent operations.

Small: Less than 1 mm of warp

Moderate: At least 1 mm but less than 3 mm of warp

Large: At least 3 mm of warp (6) Film Formability

A prepared film was biaxially oriented at the same speed in both directions and 400° C. on a polymeric film biaxial orientation system for laboratory use (BIX-703, manufactured by Iwamoto Seisakusho Co., Ltd.), and the film surface area at break was determined. The preheating time was 60 seconds and the one-side stretch rate was 10 cm/min.

Excellent: Areal stretch ratio at break is greater than 1.3.

Good: Areal stretch ratio at break is 1.1 to 1.2.

Fair: Areal stretch ratio at break is 1 to 1.1. Acceptable for practical purposes.

Poor: Areal stretch ratio at break is less than 1. Film formation is difficult.

(7) Thermal Shrinkage

The percent dimensional change before and after heating at 300° C. for 1 hour was measured in accordance with JIS-C2318.

$$\text{Percent thermal shrinkage}=100\times(A-B)/A$$

where

A represents the film dimensions before heating

B represents the film dimensions after heating

Good: Less than 0.05%

Fair: At least 0.05% but less than 0.1%

Poor: More than 0.1%

(8) Glass Transition Temperature (Tg)

The glass transition temperature was determined based on tan δ and E' (storage elastic modulus) from the dynamic viscoelasticity measured by the tensile method using a viscoelasticity analyzer (RSA2, manufactured by Rheometric Scientific, Inc.). Tg is the temperature at which E' decreases about one order of magnitude from the value at room temperature.

Example 1

A 500 cc glass flask was charged with 150 ml of dimethylacetamide, following which 3,4'-oxydianiline was added to the dimethylacetamide and dissolved, then 4,4'-oxydianiline and pyromellitic dianhydride were successively added. The flask contents were stirred at room temperature for about one hour, ultimately giving a solution containing 20 wt % of a polyamic acid of the composition shown in Table 1 in which the tetracarboxylic dianhydride and the diamines were about 100 mol % stoichiometric.

Next, 30 g of this polyamic acid solution was mixed with 12.7 ml of dimethylacetamide, 3.6 ml of acetic anhydride and 3.6 ml of β-picoline to form a mixed solution. The resulting solution was cast onto a glass plate, then heated for about 4 minutes over a 150° C. hot plate, thereby forming a self-supporting polyamic acid-polyimide gel film. The film was subsequently peeled from the glass plate.

The gel film was set in a metal holding frame equipped with numerous pins and heated for 30 minutes while raising the temperature from 250° C. to 330° C., then heated for about 5 minutes at 400° C., giving a polyimide film having a thickness of about 25 μm.

The properties of the resulting polyimide film are shown in Table 1.

Examples 2 to 3

A 500 cc glass flask was charged with 150 ml of dimethylacetamide, following which 4,4'-oxydianiline was added to the dimethylacetamide and dissolved, then pyromellitic dianhydride was added and the flask contents were stirred at room temperature for about one hour. 3,4'-Oxydianiline was subsequently fed to the resulting polyamic acid solution and completely dissolved, following which the flask contents were stirred at room temperature for about one hour. Next, phthalic anhydride was added in an amount of 1 mol %, based on the diamines, and the flask contents were again stirred for about one hour, giving a solution containing 20 wt % of a polyamic acid of the composition shown in Table 1 in which the tetracarboxylic dianhydride and the diamines were about 100 mol % stoichiometric.

In each example, this solution having a polyamic acid concentration of 20 wt % was treated by the same method as in Example 1, giving polyimide films having a thickness of about 25 μm.

The properties of the resulting polyimide films are shown in Table 1.

Example 4

A 500 cc glass flask was charged with 150 ml of dimethylacetamide, following which 3,4'-oxydianiline was added to the dimethylacetamide and dissolved. Pyromellitic dianhydride was then added and the flask contents were stirred at room temperature for about one hour. Next, acetic anhydride was added in an amount of 1 mol %, based on the diamine component, and the flask contents were again stirred for about one hour. 4,4'-Oxydianiline was then added to this polyamic acid solution and completely dissolved, following which pyromellitic dianhydride was added and the flask contents were stirred at room temperature for about one hour, yielding a solution containing 23 wt % of a polyamic acid of the composition shown in Table 2 in which the tetracarboxylic dianhydride and the diamines were about 100 mol % stoichiometric.

The polyamic acid solution was treated by the same method as in Example 1, giving a polyimide film having a thickness of about 50 μm.

The properties of the resulting polyimide film are shown in Table 2.

TABLE 1

Copolyimide films

| | Constituents (mol %) | | | Elastic modulus | Thermal expansion coefficient | Elongation | Alkali | Warping of metal | Film | Percent thermal | |
|---|---|---|---|---|---|---|---|---|---|---|---|
| | PMDA | 44'-ODA | 34'-ODA | (GPa) | (ppm/° C.) | (%) | etchability | laminate | formability | shrinkage | Tg |
| Example 1 | 100 | 70 | 30 | 3.2 | 24.6 | 60 | good | moderate | good | good | >350 |
| Example 2 | 100 | 50 | 50 | 3.7 | 23.1 | 70 | good | moderate | good | good | >350 |
| Example 3 | 100 | 30 | 70 | 4.1 | 21.5 | 80 | good | moderate | good | good | >350 |

TABLE 2

IPN polyimide films

| | Constituents (mol %) | | | | Elastic modulus | Thermal expansion coefficient | Elongation | Alkali | Warping of metal | Film | Percent thermal | |
|---|---|---|---|---|---|---|---|---|---|---|---|---|
| | Primary polymer | | Secondary polymer | | | | | | | | | |
| | PMDA | 34'-ODA | PMDA | 44'-ODA | (GPa) | (ppm/° C.) | (%) | etchability | laminate | formability | shrinkage | Tg |
| Example 4 | 30 | 70 | 70 | 70 | 4.1 | 22.0 | 65 | good | small | fair | good | >350 |

Example 5

In a similar fashion to that outlined in Example 1 or Examples 2–3, a polyimide film can be prepared with a molar ratio of 3,4'-ODA to 4,4'-ODA of 78/22. The properties can be measured in a similar fashion to that of the other films. Warping of metal laminate is predicted to be somewhat better (smaller) than Example 3, while the percent thermal shrinkage is predicted to be slightly higher than that of Example 3. Reducing the 3,4'-ODA/4,4'-ODA ratio further towards 70/30 (Example 3) would be expected to result in film properties further approaching those of the film from Example 3, i.e. somewhat more warpage of the laminate compared to this example, but somewhat better thermal shrinkage performance.

Comparative Example 1

A 500 cc glass flask was charged with 150 ml of dimethylacetamide, following which 3,4'-oxydianiline was added to the dimethylacetamide and dissolved, then pyromellitic dianhydride was added and dissolved. The flask contents were stirred at room temperature for about one hour, giving a solution containing 20 wt % of a polyamic acid of the composition shown in Table 3 in which the tetracarboxylic dianhydride and the diamine were about 100 mol % stoichiometric.

This polyamic acid solution was treated by the same method as in Example 1, giving a polyimide film having a thickness of about 25 μm.

The properties of the resulting polyimide film are shown in Table 3.

Comparative Example 2

Following the same general procedure as in Comparative Example 1, a 500 cc glass flask was charged with 150 ml of dimethylacetamide, following which the starting materials in the proportions shown in Table 3 were successively added to the dimethylacetamide and dissolved. The flask contents were stirred at room temperature for about one hour, giving a solution containing 20 wt % of a polyamic acid of the composition shown in Table 3 in which the tetracarboxylic dianhydride and the diamine were about 100 mol % stoichiometric.

This polyamic acid solution was treated by the same method as in Example 1, giving a polyimide film having a thickness of about 25 μm.

The properties of the resulting polyimide film are shown in Table 3.

TABLE 3

| | Constituents (mol %) | | | Elastic modulus | Thermal expansion coefficient | Elongation | Alkali | Warping of metal | Film form- | Percent thermal | |
|---|---|---|---|---|---|---|---|---|---|---|---|
| | PMDA | 44'-ODA | 34'-ODA | (GPa) | (ppm/° C.) | (%) | etchability | laminate | ability | shrinkage | Tg |
| Comp. Ex. 1 | 100 | 0 | 100 | 4.7 | 19 | 100 | good | small | good | poor | 320 |
| Comp. Ex. 2 | 100 | 100 | 0 | 2.6 | 27 | 40 | good | large | poor | good | >350 |

As is apparent from the results shown in Tables 1 to 3, unlike the two-component polyimide films prepared in the comparative examples, random copolyimide films, block copolyimide films and IPN polyimide films according to the present invention produced from pyromellitic dianhydride, 4,4'-oxydianiline and 3,4'-oxydianiline by a chemical conversion process satisfy all the desired properties (high elastic modulus, low thermal expansion coefficient, alkali etchability, good film formability) at once. Such characteristics make the inventive films highly suitable as metal interconnect circuit substrates for use in flexible printed circuits, chip scale packages, ball grid arrays and TAB tape.

As demonstrated above, compared with polyimide films produced by a thermal conversion process, polyimide films according to the invention, when used in metal interconnect circuit substrates for flexible printed circuits, chip scale packages, ball grid arrays or TAB tape, exhibit a high elastic modulus, a low thermal expansion coefficient, alkali etchability and excellent film formability.

Therefore, metal interconnect-boards for use in flexible printed circuits, chip scale packages, ball grid arrays or TAB tape which are produced by using the polyimide film of the invention as the substrate and providing metal interconnects on the surface thereof exhibit an excellent performance characterized by a good balance of properties: high elastic modulus, low thermal expansion coefficient, low moisture expansion coefficient, low moisture uptake, and alkali etchability.

What is claimed is:

1. A polyimide film manufactured from a polyamic acid prepared from pyromellitic dianhydride in combination with 22 to 78 mol % of 4,4'-oxydianiline and 22 to 78 mol % of 3,4'-oxydianiline, based on the overall diamine and wherein said film has: a. a thermal expansion coefficient of 10 to 24.6 ppm/° C.; b. an elastic modulus of 3 to 5.5 GPa; and c. an elongation of at least 60%.

2. A polyimide film manufactured from a polyamic acid selected from a block component-containing polyamic acid and an interpenetrating polymer network component-containing polyamic acid, wherein said polyamic acid is prepared from pyromellitic dianhydride in combination with 22 to 78 mol % of 4,4'-oxydianiline and 22 to 78 mol % of 3,4'-oxydianiline, based on the overall diainine and wherein said film has: a. a thermal expansion coefficient of 10 to 24.6 ppm/° C.; b. an elastic modulus of 3 to 5.5 GPa; and c. an elongation of at least 60%.

3. The polyimide film of claim 1 or 2 made using 30 to 70 mol % of 4,4'-oxydianiline and 30 to 70 mol % of 3,4'-oxydianiline.

4. A method of manufacturing a polyimide film, the method comprising the steps of, in order:

(A) reacting starting materials comprising (a1) a tetracarboxylic acid dianhydride comprising pyromellitic dianhydride and (a2) a first diamine selected from 4,4'-oxydianiline and 3,4'-oxydianiline, in an inert solvent to form a first polyamic acid solution containing a component selected from a block component of the first diamine and pyromellitic dianhydride and an interpenetrating polymer network component of the first diamine and pyromellitic dianhydride;

(B) adding to the first polyamic acid prepared in step A additional materials comprising (b1) a tetracarboxylic acid dianhydride comprising pyromellitic dianhydride and (b2) a second diamine selected from 4,4'-oxydianiline and 3,4'-oxydianiline, and continuing the reaction with all the materials to form a second polyamic acid solution;

(C) mixing into the second polyamic acid solution obtained in step B a chemical agent capable of converting the polyamic acid into polyimide;

(D) casting or extruding the mixture from step C onto a smooth surface to form a polyamic acid-polyimide gel film;

(E) heating the gel film at 200 to 500° C. to transform the polyamic acid to polyimide wherein at least one of the first diamine and second diamine is a phenylenediamine, and at least one of the first diamine and second diamine is 4,4'-oxydianiline.

5. The method of claim 4, wherein the second polyamic acid is selected from a block component-containing polyamic acid and an interpenetrating polymer network component-containing polyamic acid, wherein said polyamic acid is prepared from pyromellitic dianhydride in combination with 22 to 78 mol % of 4,4'-oxydianiline and 22 to 78 mol % of 3,4'-oxydianiline, based on the overall diamine.

6. A metal interconnect board for use in flexible printed circuits or tape-automated bonding tape, which board is produced by using the polyimide film of claim 1 as the substrate and providing metal interconnects on the surface thereof.

7. A film in accordance with claim 1 further comprising less than 50 mole % biphenyltetracarboxylic dianhydride or benzophenonetetracarboxylic dianhydride, based on the total moles of tetracarboxylic dianhydride.

8. A film in accordance with claim 7, wherein the polyamic acid is prepared from 50 to 78 mol % of 4,4'-oxydianiline or 50 to 78 mol % of 3,4'-oxydianiline, based n the overall diamine.

9. A film in accordance with claim 7, wherein the polyamic acid is prepared from 30 to 50 mol % of 4,4'-oxydianiline or 30 to 50 mol % of 3,4'-oxydianiline, based on the overall diamine.

10. A film in accordance with claim 7, wherein the polyamic acid is prepared from 50 to 70 mol % of 4,4'-oxydianiline or 50 to 70 mol % of 3,4'-oxydianiline, based on the overall disinine.

11. A film in accordance with claim 7, wherein the polyamic acid is prepared from 22 to 70 mol % of 4,4'-oxydianiline or 22 to 70 mol % of 3,4'-oxydianiline, based on the overall diamine.

12. A film in accordance with claim 7, wherein the polyamic acid is prepared from 30 to 70 mol % of 4,4'-oxydianiline or 30 to 70 mol % of 3,4'-oxydianiline, based on the overall diamine.

* * * * *